(12) United States Patent
Luo et al.

(10) Patent No.: US 10,948,831 B2
(45) Date of Patent: Mar. 16, 2021

(54) METHODS OF DETERMINING PROCESS MODELS BY MACHINE LEARNING

(71) Applicant: ASML NETHERLANDS B.V., Veldhoven (NL)

(72) Inventors: Ya Luo, Saratoga, CA (US); Yu Cao, Saratoga, CA (US); Jen-Shiang Wang, Sunnyvale, CA (US); Yen-Wen Lu, Saratoga, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/484,186

(22) PCT Filed: Feb. 20, 2018

(86) PCT No.: PCT/EP2018/054165
§ 371 (c)(1),
(2) Date: Aug. 7, 2019

(87) PCT Pub. No.: WO2018/153866
PCT Pub. Date: Aug. 30, 2018

(65) Prior Publication Data
US 2020/0026196 A1 Jan. 23, 2020

Related U.S. Application Data

(60) Provisional application No. 62/463,560, filed on Feb. 24, 2017.

(51) Int. Cl.
*G03F 7/20* (2006.01)
*G06N 20/00* (2019.01)
(Continued)

(52) U.S. Cl.
CPC .......... *G03F 7/705* (2013.01); *G03F 7/70125* (2013.01); *G06K 9/6263* (2013.01);
(Continued)

(58) Field of Classification Search
CPC .. G03F 7/70125; G03F 7/705; G03F 7/70616; G03F 7/70625; G03F 7/70633;
(Continued)

(56) References Cited

U.S. PATENT DOCUMENTS 6,046,792 A 4/2000 Van Der Werf et al.
7,587,704 B2 9/2009 Ye et al.
(Continued)

FOREIGN PATENT DOCUMENTS

CN 102057329 5/2011
TW 495644 7/2002
(Continued)

OTHER PUBLICATIONS

International Search Report and Written Opinion issued in corresponding PCT Patent Application No. PCT/EP2018/054165, dated Jun. 6, 2018.
(Continued)

*Primary Examiner* — Colin W Kreutzer
(74) *Attorney, Agent, or Firm* — Pillsbury Winthrop Shaw Pittman LLP

(57) ABSTRACT

Methods of determining, and using, a patterning process model that is a machine learning model. The process model is trained partially based on simulation or based on a non-machine learning model. The training data may include inputs obtained from a design layout, patterning process measurements, and image measurements.

22 Claims, 12 Drawing Sheets

(51) Int. Cl.
  *G06K 9/62* (2006.01)
  *G06N 20/10* (2019.01)
(52) U.S. Cl.
  CPC ........... *G06K 9/6269* (2013.01); *G06N 20/00* (2019.01); *G06N 20/10* (2019.01)
(58) Field of Classification Search
  CPC .... G06K 9/6263; G06K 9/6269; G06N 20/00; G06N 20/10; G06N 20/20
  USPC ...................................... 355/53, 77; 706/12
  See application file for complete search history.

(56) References Cited

U.S. PATENT DOCUMENTS

| | | |
|---|---|---|
| 2005/0192914 A1 | 9/2005 | Drege et al. |
| 2009/0157360 A1 | 6/2009 | Ye et al. |
| 2010/0010784 A1 | 1/2010 | Cao et al. |
| 2012/0220058 A1 | 8/2012 | Jung et al. |
| 2013/0179847 A1 | 7/2013 | Hansen |
| 2014/0123084 A1 | 5/2014 | Tang et al. |
| 2016/0148850 A1 | 5/2016 | David |
| 2016/0313651 A1 | 10/2016 | Middlebrooks et al. |

FOREIGN PATENT DOCUMENTS

| | | | |
|---|---|---|---|
| WO | WO-2015090774 A1 * | 6/2015 | ............. G06N 20/00 |
| WO | 2016096309 | 6/2016 | |

OTHER PUBLICATIONS

Taiwanese Office Action issued in corresponding Taiwanese Patent Application No. 107106084, dated Nov. 26, 2018,.

Ding, Duo, et al., "High Performance Lithography Hotspot Detection with Successively Refined Pattern Identifications and Machine Learning", IEEE Transactions on Computer-Aided Design of Integrated Circuits and Systems, vol. 30, No. 11, Nov. 1, 2011.

* cited by examiner

METHODS OF DETERMINING PROCESS MODELS BY MACHINE LEARNING

CROSS-REFERENCE TO RELATED APPLICATIONS

This application is the U.S. national phase entry of PCT Patent Application No. PCT/EP2018/054165, filed on Feb. 20, 2018, which claims the benefit of priority of U.S. Provisional Application No. 62/463,560, which was filed on Feb. 24, 2017, and entitled "Methods of Determining Process Models by Machine Learning," and which is incorporated herein in its entirety by reference.

TECHNICAL FIELD

The description herein relates to process modeling in device manufacturing.

BACKGROUND

A lithographic projection apparatus can be used, for example, in the manufacture of integrated circuits (ICs) or other devices. In such a case, a patterning device (e.g., a mask) may contain or provide a pattern corresponding to an individual layer of the IC or other device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of ICs, where patterns formed on substrates define functional elements of devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Disclosed herein is a method comprising: obtaining values of inputs of a process model of a lithographic process; obtaining values of a first set of characteristics of an image formed on a substrate under a processing condition represented by the values of the inputs; obtaining simulated values of a second set of characteristics of the image; and using a computer, determining the process model based on training data comprising a sample whose feature vector comprises the values of the inputs and whose supervisory signal comprises the values of the first set of characteristics, and based on the simulated values of the second characteristics.

According to an embodiment, the values of the inputs are obtained from a design layout or by measurements on the lithographic process.

According to an embodiment, the values of the inputs comprise values of characteristics of an illumination source, values of characteristics of projection optics, values of characteristics of a patterning device, or values of characteristics of post-exposure procedures.

According to an embodiment, the values of the first set of characteristics are obtained by measuring the image or simulating the image.

According to an embodiment, the first set of characteristics and the second set of characteristics are different.

According to an embodiment, the simulated values are obtained based on the values of the inputs.

According to an embodiment, determining the process model comprises using the simulated values as constraints.

Disclosed herein is a method comprising: obtaining a reference process model of a lithographic process; obtaining second values of inputs of a process model of the lithographic process; obtaining values of a second set of characteristics of an image formed on a substrate under a processing condition represented by the second values of the inputs of the process model; using a computer, determining the process model based on second training data comprising a second sample whose feature vector comprises the second values of the inputs of the process model and whose supervisory signal comprises the values of the second set of characteristics, and based on the reference process model.

According to an embodiment, obtaining the reference process model comprises: obtaining first values of inputs of the reference process model; obtaining simulated values of a first set of characteristics of an image formed on a substrate under a processing condition represented by the first values of the inputs of the reference process; determining the reference process model based on first training data comprising a first sample whose feature vector comprises the first values of the inputs of the reference process model and whose supervisory signal comprises the simulated values of the first set of characteristics.

According to an embodiment, the first values of the inputs are obtained from a design layout or by simulation of the lithographic process.

According to an embodiment, the first values of the inputs comprise values of characteristics of an illumination source, values of characteristics of projection optics, values of characteristics of a patterning device, or values of characteristics of post-exposure procedures.

According to an embodiment, the simulated values of the first set of characteristics are obtained by simulating the image.

According to an embodiment, the simulated values of the first set of characteristics are obtained based on the first values of the inputs.

According to an embodiment, the second values of the inputs comprise values of characteristics of an illumination source, values of characteristics of projection optics, values of characteristics of a patterning device, or values of characteristics of post-exposure procedures.

According to an embodiment, the values of the second set of characteristics are obtained by measuring the image.

According to an embodiment, determining the process model comprises using the reference process model as constraints.

Disclosed herein is a method comprising: obtaining values of a plurality of design variables; producing an output of a process model by providing the values of the design variables to the process model as inputs thereof; computing a cost function of the design variables, the cost function representing a deviation between the output and target values; upon determination that a termination condition is not satisfied, adjusting the values of the design variables.

According to an embodiment, the plurality of design variables comprise design variables representing characteristics of an illumination source, design variables representing characteristics of projection optics, or design variables representing characteristics of a design layout.

According to an embodiment, the output comprises simulated values of characteristics of an image formed on a substrate under a processing condition represented by the values of the design variables.

According to an embodiment, adjusting the values of the design variables is based on the process model.

According to an embodiment, adjusting the values of the design variables is based on gradients of the cost function with respect to the values of the design variables.

Disclosed herein is a method comprising: obtaining a processing condition or a location on a substrate; determining first inputs to a first process model based on the processing condition or the location, the first process model being a machine learning model; determining an output of the first process model from the first inputs; determining second inputs to a second process model based on the processing condition or the location, the second process model being a non-machine learning model; determining an output of the second process model from the second inputs; determining deviations between the output of the first process model and the output of the second process model; upon determination that the deviations satisfy a condition, adjusting the first process model.

According to an embodiment, the first process model is trained based on the second process model.

According to an embodiment, the deviations depend on the location or the processing condition.

According to an embodiment, adjusting the first process model comprises retraining the first process model.

According to an embodiment, adjusting the first process model comprises combining the first process model with the second process model.

Disclosed herein is a method comprising: obtaining a target value of a characteristic of a result of a lithographic process; obtaining values of characteristics of the lithographic process that would achieve that result; using a computer, determining a model based on training data comprising a sample whose feature vector comprises the target value and whose supervisory signal comprises the values of the characteristics of the lithographic process.

According to an embodiment, the result is an image formed by the lithographic process.

According to an embodiment, the characteristic of the result is a CD in the image.

According to an embodiment, the characteristic of the result is a location of an edge in the image.

Disclosed herein is a computer program product comprising a non-transitory computer readable medium having instructions recorded thereon, the instructions when executed by a computer implementing any of the methods herein.

DETAILED DESCRIPTION

Figure 1:
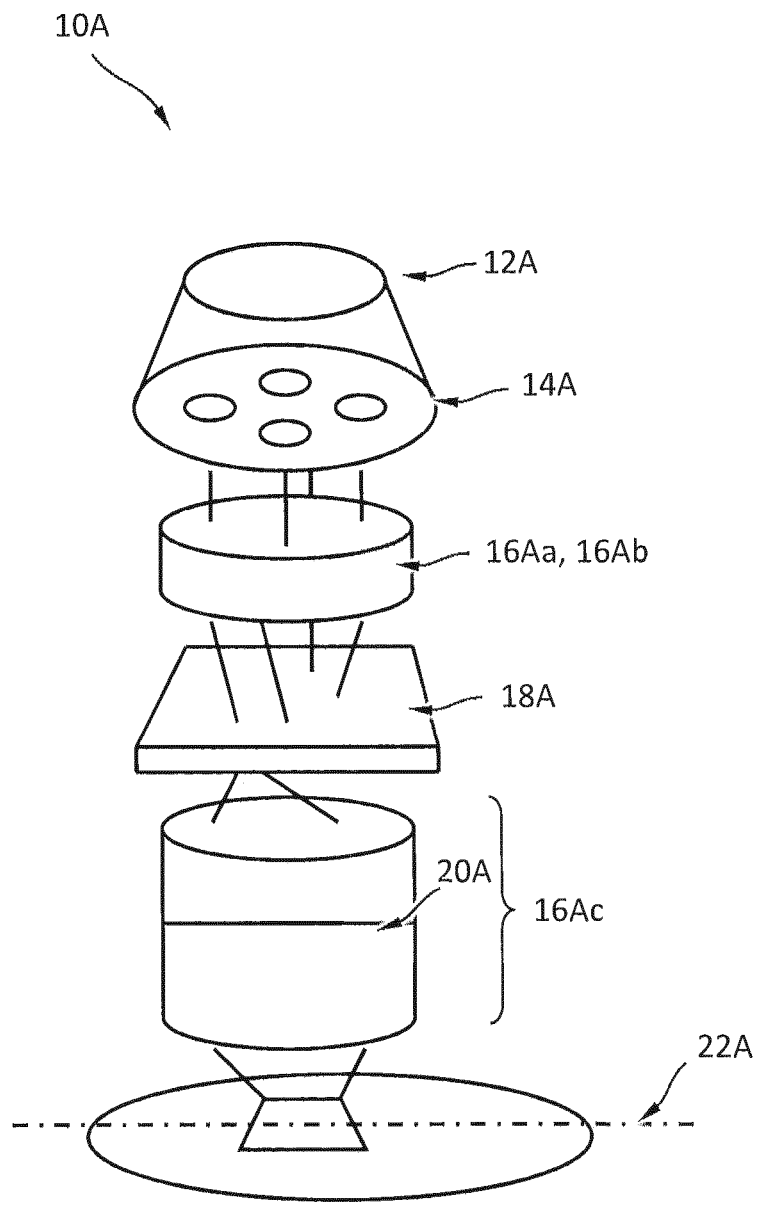
FIG. 1 shows a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimensions" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original device design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.

a programmable LCD array.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin ($\Theta_{max}$), wherein n is the refractive index of the media between the last element of projection optics and the substrate, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, post exposure bake and development). Optical properties of the lithographic projection apparatus (e.g., properties of the source, the patterning device and the projection optics) dictate the aerial image. Since the patterning device used in the lithographic apparatus can be changed, it may be desirable to separate the properties of the patterning device from the properties of the rest of the lithographic apparatus including, for example, at least the source and the projection optics.

The term "optimizing" and "optimization" as used herein refers to or means adjusting a patterning process, a patterning process apparatus, etc. such that results and/or processes of the patterning process (e.g., the lithography step) have one or more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In an optimization process of a system, a figure of merit of the system can be represented as a cost function. The optimization process boils down to a process of finding a set of parameters (design variables) of the system that optimizes (e.g., minimizes or maximizes) the cost function. The cost function can have any suitable form depending on the goal of the optimization. For example, the cost function can be weighted root mean square (RMS) of deviations of certain characteristics of the system with respect to the intended values (e.g., ideal values) of these characteristics; the cost function can also be the maximum of these deviations (i.e., worst deviation). The design variables of the system can be confined to finite ranges and/or be interdependent due to practicalities of implementations of the system. In the case of a lithographic apparatus, for example, the constraints are often associated with physical properties and characteristics of the hardware such as tunable ranges, and/or patterning device manufacturability design rules.

Figure 2:
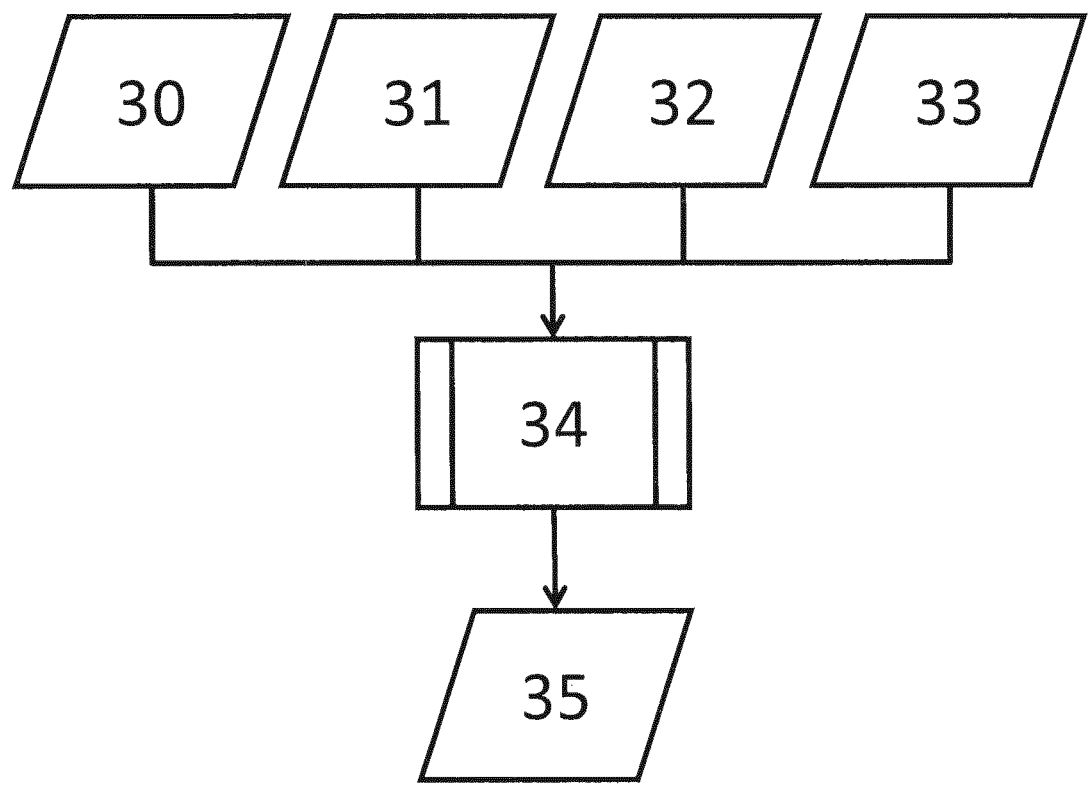
FIG. 2 shows a flowchart for simulating lithography in a lithographic projection apparatus.

An exemplary flow chart for simulating a patterning process using a lithographic apparatus is illustrated in FIG. 2. One or more characteristics 31 (e.g., radiation intensity distribution and/or phase distribution) of the illumination, one or more characteristics 32 (e.g., a change to the radiation intensity distribution and/or to the phase distribution caused by the projection optics) of the projection optics, one or more characteristics 33 (e.g., one or more changes to the radiation intensity distribution and/or to the phase distribution caused by an arrangement of features on or formed by the patterning device that represent a given design layout) of the patterning device, and/or one or more characteristics 30 of one or more post-exposure procedures are provided to a process model 34 as inputs thereto. The process model 34 determines, using these inputs, one or more characteristics (e.g., a contour and/or CD) of an image 35 (an aerial image, resist image and/or etch image). An etch image can be defined as a spatial distribution of the amount of etching in the substrate after the substrate is etched using the developed resist thereon as an etch mask.

More specifically, it is noted that the one or more characteristics 31 can include one or more optical characteristics of the illumination system that include, but not limited to, a numerical aperture setting, an illumination sigma ($\sigma$) setting and/or a particular illumination shape (e.g. an off-axis radiation source such as annular, quadrupole, dipole, etc.). The one or more characteristics 32 can include one or more optical characteristics of the projection optics, including aberration, distortion, a refractive index, a physical size, a physical dimension, etc. The one or more characteristics 33 can include one or more physical properties of a physical patterning device, as described, for example, in U.S. Pat. No. 7,587,704, which is incorporated by reference in its entirety. The simulation can predict, for example, edge placement, aerial image intensity slope and/or CD, which can then be compared against an intended design. The intended design is generally defined as a pre-OPC design layout which can be provided in a standardized digital file format such as GDSII or OASIS or other file format.

The process model 34 may be a computational or an empirical model. A computational model simulates the image 35 or one or more characteristics thereof from the inputs by mathematically following the underlying physical or chemical processes. Computational models tend to be computationally expensive and mathematically describing underlying physical or chemical processes tends to be difficult. An empirical model, in contrast, determines the image 35 or one or more characteristics thereof from the inputs using correlations between them. An empirical model does not have to use any understanding of the underlying physical or chemical processes.

An example of an empirical model is a machine learning model. An unsupervised machine learning model or a supervised machine learning model may be used as a process model. Without limiting the scope of the invention, applications of supervised machine learning algorithms are described below.

Supervised learning is the machine learning task of inferring a function from labeled training data. The training data comprises or consists of a set of training samples. In supervised learning, each sample is a pair comprising or consisting of an input object (typically a vector, which may be called a feature vector) and a desired output value (also called the supervisory signal). In an embodiment, the feature vector of each of the training samples may include values of the inputs of the process model 34 and the supervisory signal may include one or more characteristics of an image formed on a substrate or a simulated image, under the processing condition represented by these values of the inputs. For example, the training data may include a number of patterns and the images of these patterns formed on a substrate under a number of processing conditions. A supervised learning algorithm analyzes the training data, and produces values of the parameters of the process model 34 (i.e., determining or parameterizing the process model 34).

Given a set of N training samples of the form $\{(x_1, y_1), (x_2, y_2), \ldots, (x_N, y_N)\}$ such that $x_i$ is the feature vector of the i-th sample and $y_i$ is its supervisory signal, a learning algorithm seeks a function g: X→Y, where X is the input space and Y is the output space. A feature vector is an n-dimensional vector of numerical features that represent some object. Many algorithms in machine learning use a numerical representation of objects, since such representations facilitate processing and statistical analysis. When representing images, the feature values might correspond to the pixels of an image, when representing texts, the feature values might perhaps correspond to term occurrence frequencies. The vector space associated with these vectors is often called the feature space. The function g is an element of some space of possible functions G, usually called the hypothesis space. It is sometimes convenient to represent g using a scoring function f: X×Y→$\mathbb{R}$ such that g is defined as returning the y value that gives the highest score:

$$g(x) = \arg\max_y f(x, y).$$

Let F denote the space of scoring functions.

Although G and F can be any space of functions, many learning algorithms are probabilistic models where g takes the form of a conditional probability model g(x)=P(y|x), or f takes the form of a joint probability model f(x, y)=P(x, y). For example, naive Bayes and linear discriminant analysis are joint probability models, whereas logistic regression is a conditional probability model.

There are two basic approaches to choosing for g: empirical risk minimization and structural risk minimization. Empirical risk minimization seeks the function that best fits the training data. Structural risk minimization includes a penalty function that controls the bias/variance tradeoff.

In both cases, it is assumed that the training set has a sample of independent and identically distributed pairs $(x_i, y_i)$. In order to measure how well a function fits the training data, a loss function L: Y×Y→$\mathbb{R}^{\geq 0}$ is defined. For training sample $(x_i, y_i)$, the loss of predicting the value $\hat{y}$ is $L(y_i, \hat{y})$.

The risk R(g) of function g is defined as the expected loss of g. This can be estimated from the training data as $$R_{emp}(g) = \frac{1}{N}\sum_i L(y_i, g(x_i)).$$

Exemplary models of supervised learning include decision trees, ensemble methods (bagging, boosting, random forest), k-NN, linear regression, naive Bayes, neural networks, logistic regression, perceptron, support vector machine (SVM), relevance vector machine (RVM), and deep learning.

SVM is an example of a supervised learning model, which analyzes data and recognizes patterns and can be used for classification and regression analysis. Given a set of training samples, each marked as belonging to one of two categories, a SVM training algorithm builds a model that assigns new samples into one category or the other, making it a non-probabilistic binary linear classifier. A SVM model is a representation of the samples as points in space, mapped so that the samples of the separate categories are divided by a clear gap that is as wide as possible. New samples are then mapped into that same space and predicted to belong to a category based on which side of the gap they fall on.

In addition to performing linear classification, SVMs can efficiently perform a non-linear classification using what is called kernel methods, implicitly mapping their inputs into high-dimensional feature spaces.

Kernel methods require only a user-specified kernel, i.e., a similarity function over pairs of data points in raw representation. Kernel methods owe their name to the use of kernel functions, which enable them to operate in a high-dimensional, implicit feature space without ever computing the coordinates of the data in that space, but rather by simply computing the inner products between the images of all pairs of data in the feature space. This operation is often computationally cheaper than the explicit computation of the coordinates. This approach is called the "kernel trick."

The effectiveness of SVM depends on the selection of kernel, the kernel's parameters, and soft margin parameter C. A common choice is a Gaussian kernel, which has a single parameter γ. The best combination of C and γ is often selected by a grid search (also known as "parameter sweep") with exponentially growing sequences of C and γ, for example, $C \in \{2^{-5}, 2^{-4}, \ldots, 2^{15}, 2^{16}\}$; $\gamma \in \{2^{-15}, 2^{-14}, \ldots, 2^4, 2^5\}$.

A grid search is an exhaustive searching through a manually specified subset of the hyperparameter space of a learning algorithm. A grid search algorithm must be guided by some performance metric, typically measured by cross-validation on the training set or evaluation on a held-out validation set.

Each combination of parameter choices may be checked using cross validation, and the parameters with best cross-validation accuracy are picked.

Cross-validation, sometimes called rotation estimation, is a model validation technique for assessing how the results of a statistical analysis will generalize to an independent data set. It is mainly used in settings where the goal is prediction, and one wants to estimate how accurately a predictive model will perform in practice. In a prediction problem, a model is usually given a dataset of known data on which training is run (training dataset), and a dataset of unknown data (or first seen data) against which the model is tested (testing dataset). The goal of cross validation is to define a dataset to "test" the model in the training phase (i.e., the validation dataset), in order to limit problems like overfitting, give an insight on how the model will generalize to an independent data set (i.e., an unknown dataset, for instance from a real problem), etc. One round of cross-validation involves partitioning a sample of data into complementary subsets, performing the analysis on one subset (called the training set), and validating the analysis on the other subset (called the validation set or testing set). To reduce variability, multiple rounds of cross-validation are performed using different partitions, and the validation results are averaged over the rounds.

The final model, which can be used for testing and for classifying new data, is then trained on the entire training set using the selected parameters.

Figure 3A:
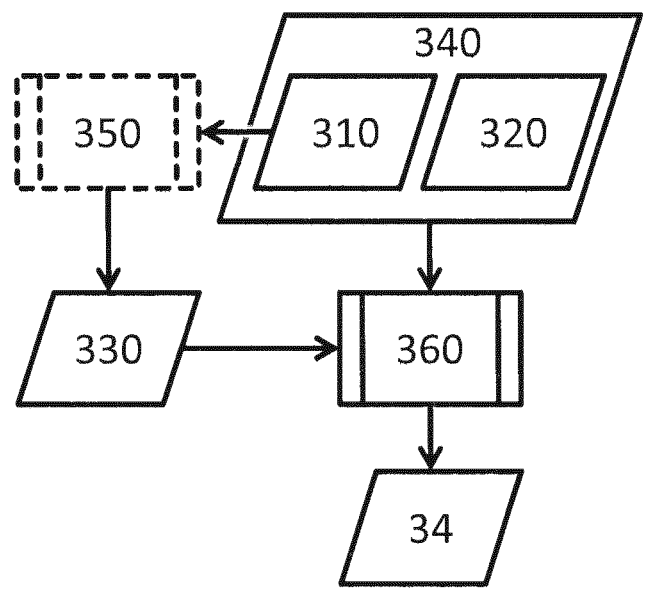
FIG. 3A schematically shows a flowchart for a method of determining a process model by machine learning, according to an embodiment.

FIG. 3A schematically shows a flowchart for a method of determining a process model by machine learning, according to an embodiment. Namely the process model determined using this method is a machine learning model. Values 310 of the inputs of the process model 34 and values 320 of a first set of one or more characteristics of an image formed on a substrate under the processing condition represented by the values 310 of the inputs are obtained. The values 310 of the inputs may be obtained from a design layout or by measurements on a patterning process. For example, the values 310 of the inputs may have values of one or more characteristics 31 (e.g., radiation intensity distribution and/or phase distribution) of the illumination, one or more characteristics 32 (e.g., a change to the radiation intensity distribution and/or to the phase distribution caused by the projection optics) of the projection optics, one or more characteristics 33 of the patterning device, and/or one or more characteristics 30 of one or more post-exposure procedures. The values 320 of the first set of characteristics of the image may be obtained by measuring the image on the substrate using a metrology tool or by simulating the image. The values 310 of the inputs and the values 320 of the first set of characteristics of the image are included in training data 340 as a sample. The values 310 are the feature vector of the sample and the values 320 are the supervisory signal of the sample. The training data 340 may have samples that include values of the inputs representing a number of patterns and/or a number of processing conditions. Simulated values 330 of a second set of one or more characteristics (same or different from the first set) of the image are obtained, for example, using a model 350 (e.g., a non-machine learning model). The simulated values may be obtained based on the values 310 of the inputs. In procedure 360, the process model 34 is determined based on the training data 340 and the simulated values 330. The simulated values 330 may be used as constraints in the procedure 360. In an example, the process model 34 may be determined in the procedure 360 under a condition that the process model 34 does not deviate from the simulated values 330 beyond a threshold. In an example, the process model 34 may be determined in the procedure 360 using a cost function that represents deviations of the output of the process model 34 from the simulated values 330.

Figure 3B:
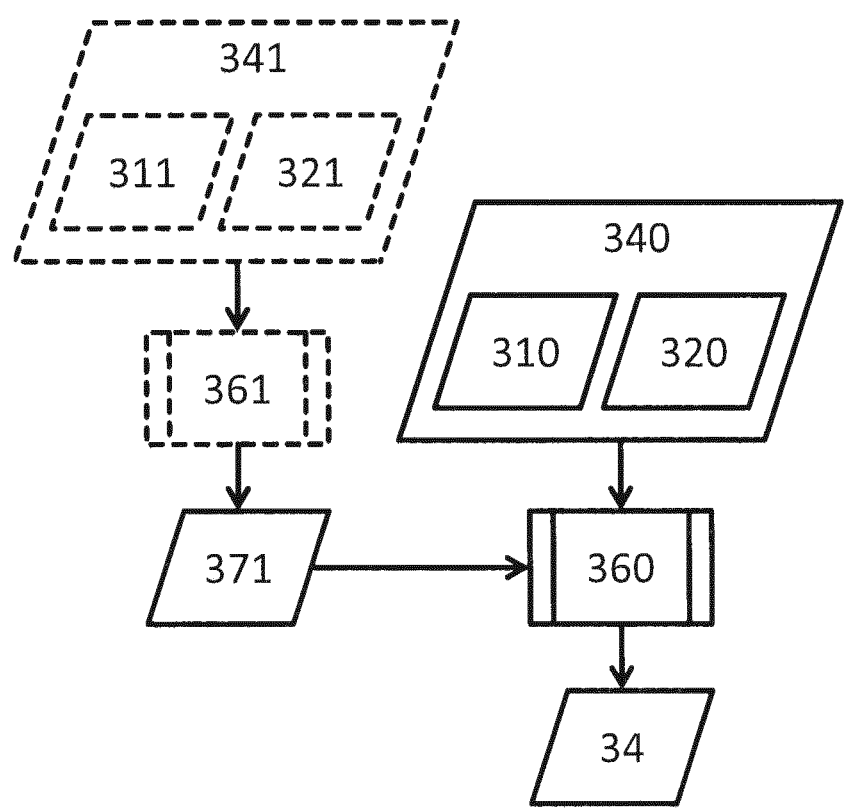
FIG. 3B schematically shows a flowchart for a method of determining a process model by machine learning, according to an embodiment.

FIG. 3B schematically shows a flowchart for a method of determining a process model by machine learning, according to an embodiment, where a reference process model 371 can be used in the determination of the process model 34. The reference process model 371 may be obtained by any suitable method. In an embodiment, the reference process model 371 is obtained by the following procedures. First values 311 of the inputs of a reference process model and simulated values 321 of a first set of one or more characteristics of an image formed on a substrate under the processing condition represented by the first values 311 are obtained. The first values 311 may be obtained from a design layout or by simulation of a patterning process (e.g., a lithography step). For example, the first values 311 may have values of one or more characteristics 31 (e.g., radiation intensity distribution and/or phase distribution) of the illumination, one or more characteristics 32 (e.g., a change to the radiation intensity distribution and/or to the phase distribution caused by the projection optics) of the projection optics, one or more characteristics 33 of the patterning device, and/or one or more characteristics 30 of one or more post-exposure procedures. The simulated values 321 may be obtained by simulating the image, for example, using a model (e.g., a non-machine learning model). The simulated values 321 may be obtained based on the first values 311. The first values 311 and the simulated values 321 are included in training data 341 as a sample. The first values 311 are the feature vector of the sample and the values 321 are the supervisory signal of the sample. The training data 341 may have samples that include values of the inputs representing a number of patterns and/or a number of processing conditions. In procedure 361, the reference process model 371 is determined based on the training data 341.

After the reference process model 371 is obtained using the procedures above or by any other suitable methods, it can be used in the determination of the process model 34. Second values 310 of the inputs of the process model 34 and values 320 of a second set of one or more characteristics of an image formed on a substrate under the processing condition represented by the second values 310 are obtained. The values 320 of the second set of characteristics of the image are obtained by measuring the image on the substrate, for example, using a metrology tool. The second values 310 of the inputs of the process model 34 may have values of one or more characteristics 31 (e.g., radiation intensity distribution and/or phase distribution) of the illumination, one or more characteristics 32 (e.g., a change to the radiation intensity distribution and/or to the phase distribution caused by the projection optics) of the projection optics, one or more characteristics 33 of the patterning device, and/or one or more characteristics 30 of one or more post-exposure procedures. The second values 310 and the values 320 are included in training data 340 as a sample. The second values 310 are the feature vector of the sample and the values 320 are the supervisory signal of the sample. The training data 340 may have samples that include values of the inputs representing a number of patterns and/or a number of processing conditions. In procedure 360, the process model 34 is determined based on the training data 340 and the reference process model 371. For example, the reference process model 371 may be used as a start in the procedure 360. For example, the reference process model 371 may be used as a constraint in the procedure 360. In an example, the process model 34 may be determined in the procedure 360 under a condition that the process model 34 does not deviate from the reference process model 371 beyond a threshold. In an example, the process model 34 may be determined in the procedure 360 using a cost function that represents deviations of the output of the process model 34 from the output of the reference process model 371.

Figure 4:
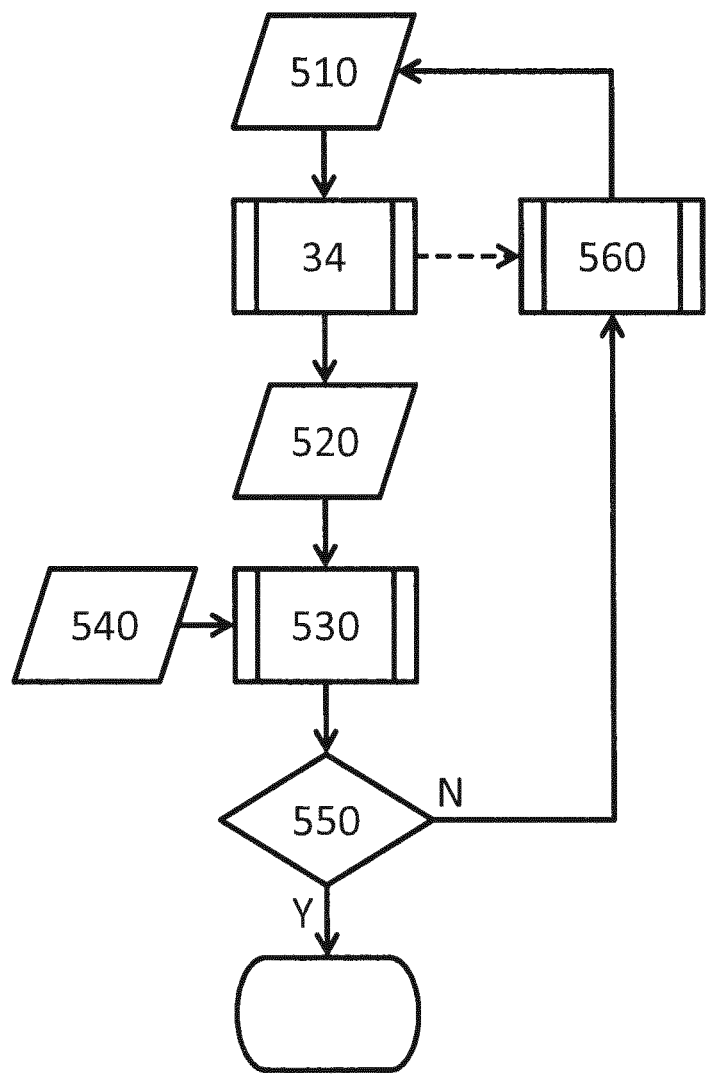
FIG. 4 schematically shows a method of using a process model, according to an embodiment.

FIG. 4 schematically shows a method of using the process model 34, according to an embodiment. Values 510 of a plurality of design variables are obtained. The design variables may comprise any suitable combination selected from one or more design variables representing one or more characteristics of the illumination source (e.g., pupil fill ratio, namely percentage of radiation of the illumination that passes through a pupil or aperture), one or more characteristics of the projection optics and/or one or more characteristics of the design layout. The values 510 of the design variables are provided to the process model 34 as inputs thereof. The process model 34 produces an output 520. The output 520 may include simulated values of one or more characteristics of an image formed on a substrate under the processing condition represented by the values 510 of the design variables. In procedure 530, a multi-variable cost function of the design variables is computed, the cost function representing a deviation between the output 520 of the process model 34 and target values 540. In procedure 550, it is determined whether a predefined termination condition is satisfied. The predetermined termination condition may include various possibilities, e.g., that the cost function reaches an extremum, that the value of the cost function is equal to a threshold value or crosses the threshold value, that the value of the cost function reaches within a preset error limit, or a preset number of iterations is reached. If the termination condition is satisfied, the flow ends. If the termination condition is not satisfied, the flow goes to procedure 560, where the values 510 of the design variables are adjusted. The values 510 of the design variables may be adjusted based on the process model 34. For example, the process model 34 may provide gradients of the cost function with respect to the values 510 of the design variables, and the design variables may be adjusted based on the gradients. Depending on the nature of the design variables, this flow may be applied to implement various RETs such as source-mask optimization and/or OPC.

Figure 5:
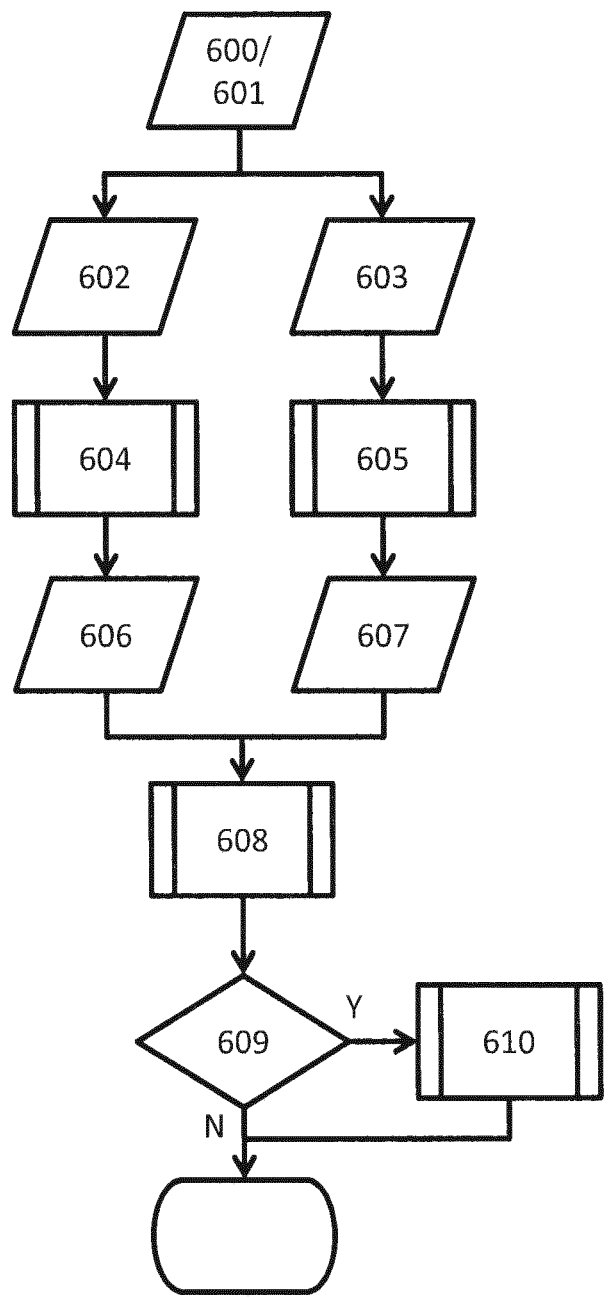
FIG. 5 schematically shows a method of validating a machine learning process model, according to an embodiment.

FIG. 5 schematically shows a method of validating a machine learning process model, according to an embodiment. A processing condition 601 or a location 600 on a substrate is obtained. From the processing condition 601 or the location 600, inputs 602 to a process model 604 that is a machine learning model are determined. An output 606 of the process model 604 is determined from the inputs 602. From the processing condition 601, inputs 603 to a process model 605 that is a non-machine learning model are determined. An output 607 of the process model 605 is determined from the inputs 603. The process model 605 may or may not be involved in the training of the process model 604. Deviations between the outputs 606 and 607 are determined in procedure 608. The deviations may depend on the location on the substrate, or depend on the processing condition. In procedure 609, it is determined whether the deviations satisfy a condition. For example, the condition may be that the deviations are above a threshold. If the condition is satisfied, the flow goes to procedure 610, where the process model 604, which is a machine learning model, is adjusted. Adjusting the process model 604 may include retraining it, combining (e.g., averaging) the process model 604 with a non-machine learning process model (e.g., process model 605), etc.

Machine learning can also be used in generating a model that takes inputs of a target value of a characteristic of a result of a patterning process, and produces values of one or more characteristics of the patterning process that would achieve that result. For example, the result may be an image (e.g., aerial image, resist image, and/or etch image) formed on a substrate by the patterning process, or a characteristic (e.g., CD, mask error enhancement factor (MEEF), process window, yield, etc.) of that image. The one or more characteristics of the patterning process may include one or more characteristics of the illumination, one or more characteristics of the patterning device, one or more characteristics of the projection optics, one or more characteristics of the post-exposure procedures, or any combination selected therefrom.

Figure 6:
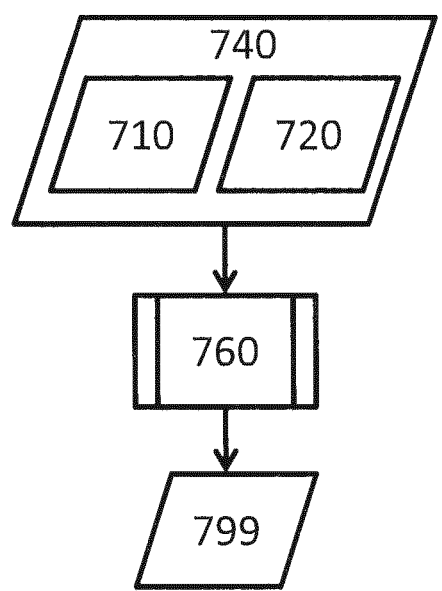
FIG. 6 schematically shows a flowchart for a method of determining a model by machine learning, according to an embodiment.

FIG. 6 schematically shows a flowchart for a method of determining such a model by machine learning, according to an embodiment. A target value 710 of a characteristic of a result of a patterning process (e.g., a lithography step) and values 720 of one or more characteristics of the patterning process (e.g., a lithography step) that would achieve that result are obtained. For example, when the result is an image and the characteristic is a CD in the image, the target value 710 is the intended value of the CD (e.g., as determined by the design layout). In an example, the characteristic of the result is a location of an edge. The target value 710 and the values 720 are included in training data 740 as a sample. The target value 710 is in the feature vector of the sample and the values 720 are the supervisory signal of the sample. In procedure 760, a model 799 is determined based on the training data 740. The model 799 takes as inputs a target value of the characteristic of the result, and produces values of the one or more characteristics of the patterning process (e.g., a lithography step) that would achieve that result.

Figure 7:
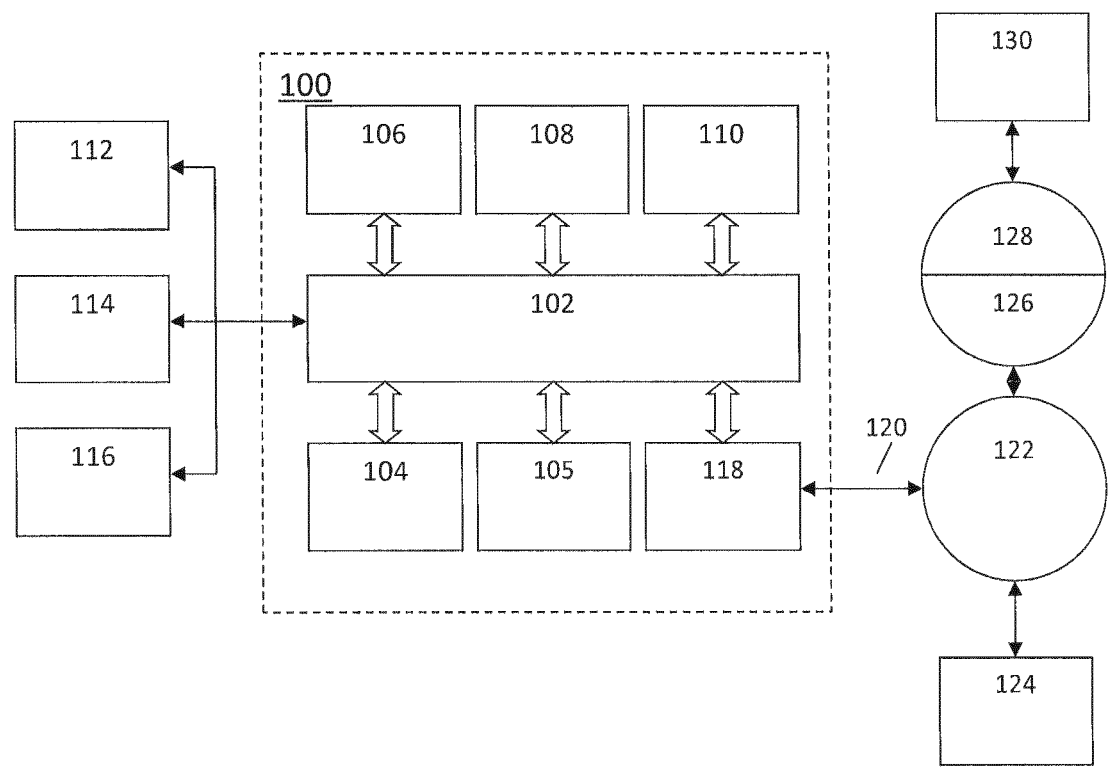
FIG. 7 is a block diagram of an example computer system.

FIG. 7 is a block diagram that illustrates a computer system 100 which can assist in implementing the methods, flows, apparatuses or systems disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, all or part of the techniques herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of the techniques described herein, for example. The received code may be executed by processor 104 as it is received, and/or stored in storage device 110, or other non-volatile storage for later execution. In this manner, computer system 100 may obtain application code in the form of a carrier wave.

Figure 8:
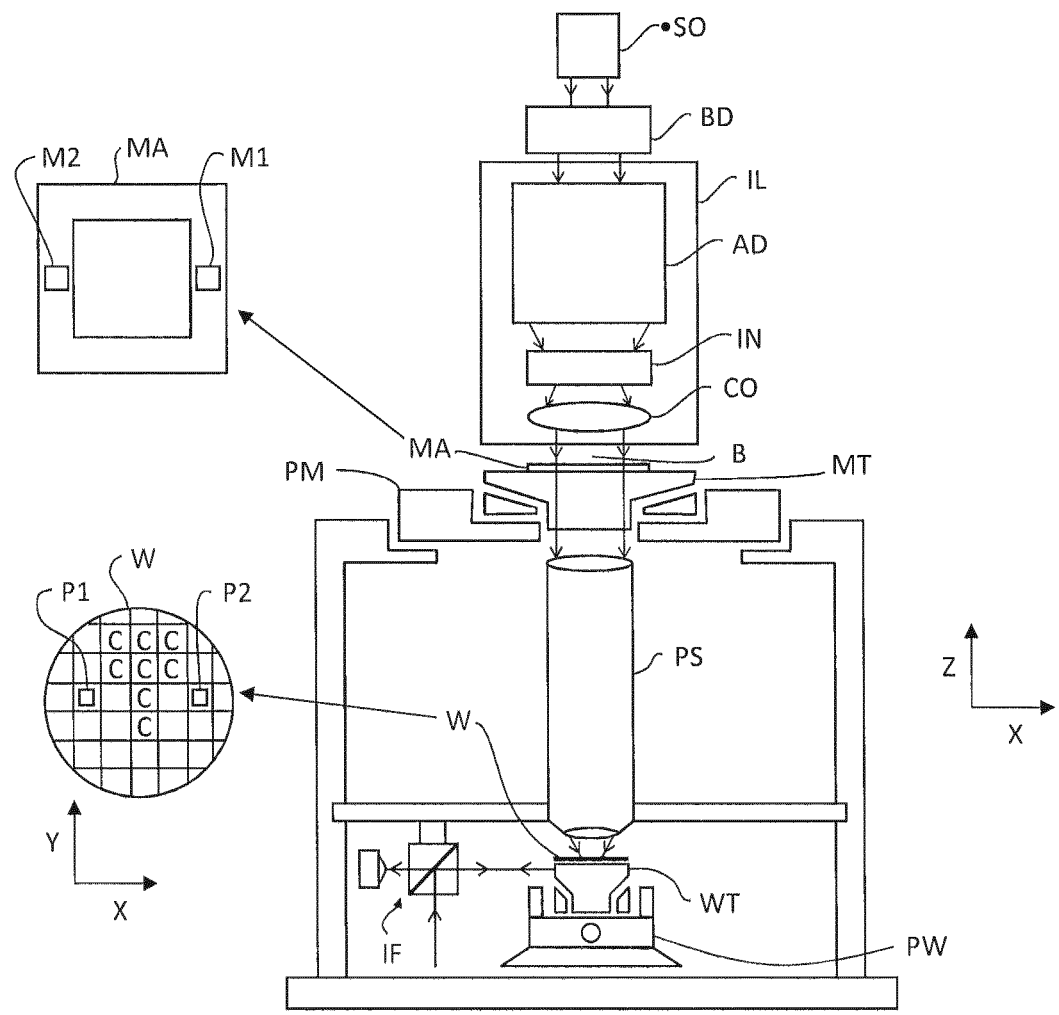
FIG. 8 is a schematic diagram of a lithographic projection apparatus.

FIG. 8 schematically depicts an exemplary lithographic projection apparatus for use with the methods described herein. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 8. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
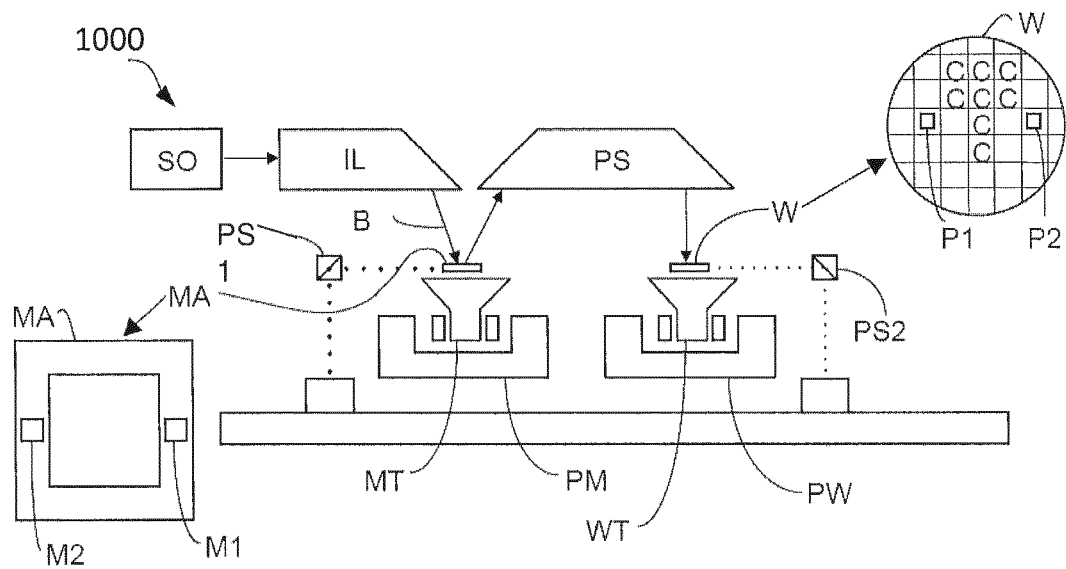
FIG. 9 is a schematic diagram of another lithographic projection apparatus.

FIG. 9 schematically depicts another exemplary lithographic projection apparatus 1000 for use with the methods described herein.

The lithographic projection apparatus 1000 comprises:
a source collector module SO
an illumination system (illuminator) IL configured to condition a radiation beam B (e.g. EUV radiation).
a support structure (e.g. a patterning device table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
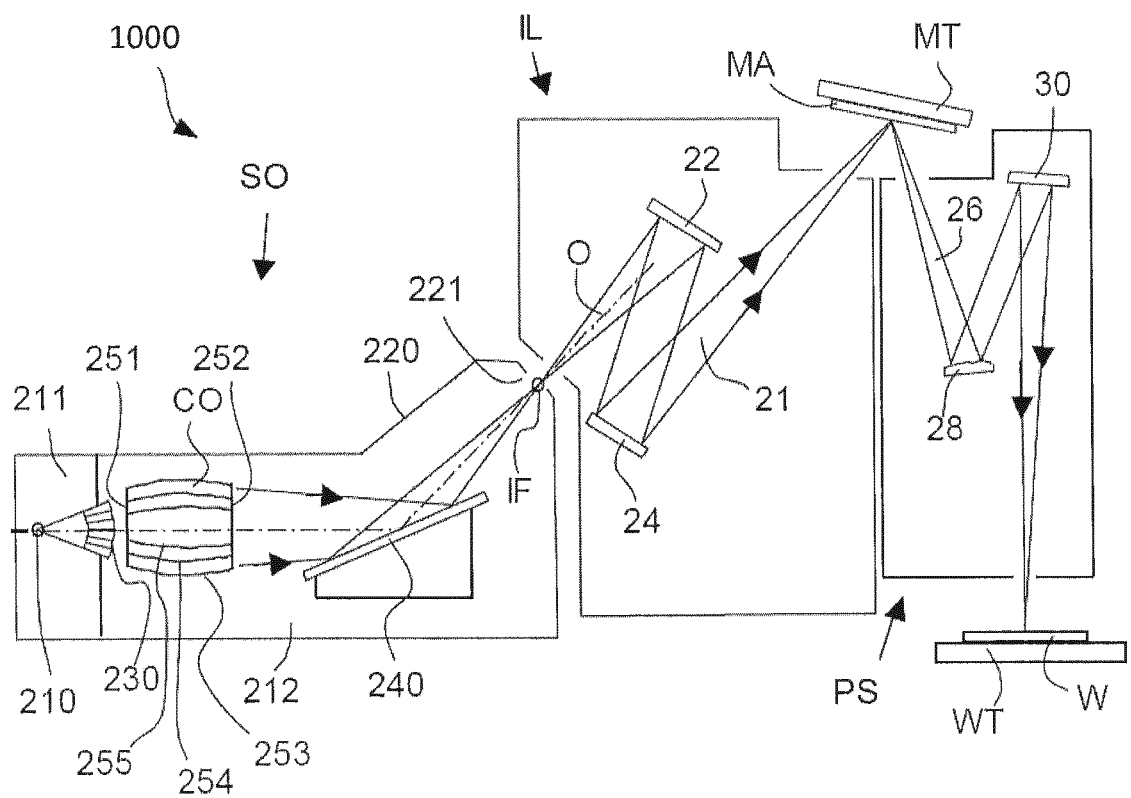
FIG. 10 is a more detailed view of the apparatus in FIG. 9.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 11:
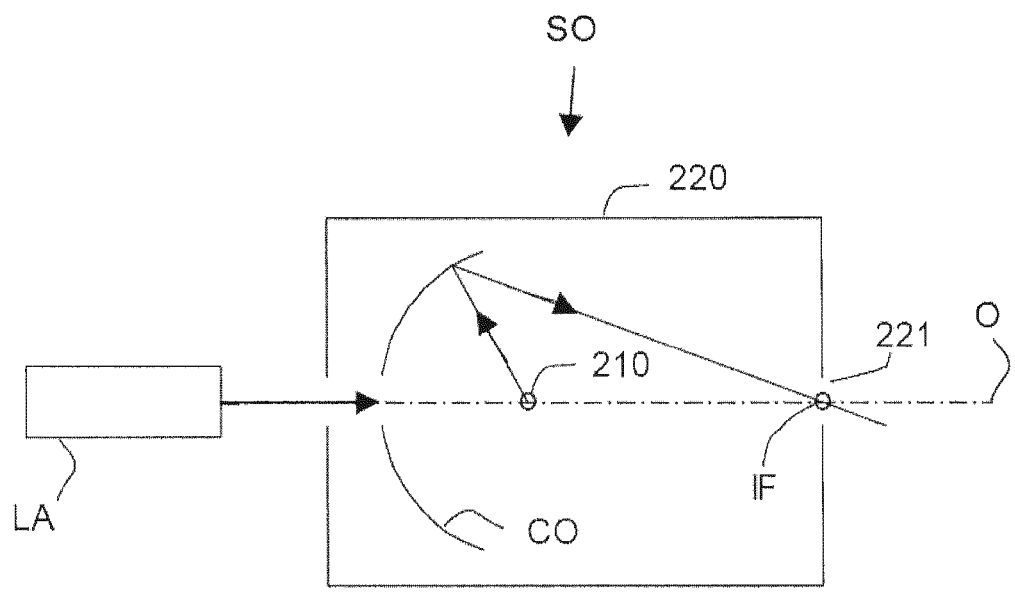
FIG. 11 is a more detailed view of the source collector module SO of the apparatus of FIG. 9 and FIG. 10.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A method comprising:
  obtaining values of inputs of a process model of a patterning process;
  obtaining values of a first set of one or more characteristics of an image formed on a substrate under a processing condition represented by the values of the inputs; obtaining simulated values of a second set of one or more characteristics of the image; and determining, by a hardware computer, the process model based on training data comprising samples whose feature vector comprises the values of the inputs and whose supervisory signal comprises the values of the first set, and based on the simulated values of the second set.
2. The method of clause 1, wherein the values of the inputs are obtained from a design layout or by measurements on the patterning process.
3. The method of clause 1 or clause 2, wherein the values of the inputs comprise values of one or more characteristics of an illumination, of one or more characteristics of projection optics, of one or more characteristics of a patterning device, and/or of one or more characteristics of one or more post-exposure procedures.
4. The method of any of clauses 1-3, wherein the values of the first set are obtained by measuring the image or simulating the image.
5. The method of any of clauses 1-4, wherein the first set and the second set are different.
6. The method of any of clauses 1-5, wherein the simulated values are obtained based on the values of the inputs.
7. The method of any of clauses 1-6, wherein determining the process model comprises using the simulated values as a constraint.
8. A method comprising:
  obtaining a reference process model of a patterning process;
  obtaining first values of inputs of a process model of the patterning process;
  obtaining values of a first set of one or more characteristics of an image formed on a substrate under a processing condition represented by the first values of the inputs; and determining, by a hardware computer, the process model based on first training data comprising first samples whose feature vector comprises the first values of the inputs of the process model and whose supervisory signal comprises the values of the second set of one or more characteristics, and based on the reference process model.

9. The method of clause 8, wherein obtaining the reference process model comprises:
obtaining second values of inputs of the reference process model;
obtaining simulated values of a second set of one or more characteristics of an image formed on a substrate under a processing condition represented by the second values of the inputs of the reference process; and
determining the reference process model based on second training data comprising second samples whose feature vector comprises the second values of the inputs of the reference process model and whose supervisory signal comprises the simulated values of the first set of one or more characteristics.

10. The method of clause 9, wherein the second values of the inputs are obtained from a design layout or by simulation of the patterning process.

11. The method of clause 9 or clause 10, wherein the second values of the inputs comprise values of one or more characteristics of an illumination, of one or more characteristics of projection optics, of one or more characteristics of a patterning device, and/or of one or more characteristics of one or more post-exposure procedures.

12. The method of any of clauses 9-11, wherein the simulated values of the second set of one or more characteristics are obtained by simulating the image.

13. The method of any of clauses 9-12, wherein the simulated values of the second set of one or more characteristics are obtained based on the second values of the inputs of the reference process model.

14. The method of any of clauses 8-13, wherein the first values of the inputs of the process model comprise values of one or more characteristics of an illumination, of one or more characteristics of projection optics, of one or more characteristics of a patterning device, and/or of one or more characteristics of one or more post-exposure procedures.

15. The method of any of clauses 8-14, wherein the values of the first set of one or more characteristics are obtained by measuring the image.

16. The method of any of clauses 8-15, wherein determining the process model comprises using the reference process model as a constraint.

17. A method comprising:
obtaining values of a plurality of design variables;
producing an output of a process model by providing the values of the design variables to the process model as inputs thereof;
computing, by a hardware computer, a cost function of the design variables, the cost function representing a deviation between the output and target values; and
upon determination that a termination condition is not satisfied, adjusting one or more values of one or more of the design variables.

18. The method of clause 17, wherein the plurality of design variables comprise design variables representing one or more characteristics of an illumination source, representing one or more characteristics of projection optics, and/or representing one or more characteristics of a design layout.

19. The method of clause 17 or clause 18, wherein the output comprises simulated values of one or more characteristics of an image formed on a substrate under a processing condition represented by the values of the design variables.

20. The method of any of clauses 17-19, wherein adjusting the one or more values of one or more of the design variables is based on the process model.

21. The method of any of clauses 17-20, wherein adjusting the one or more values of one or more of the design variables is based on a gradient of the cost function with respect to one or more values of one or more of the design variables.

22. A method comprising:
obtaining a processing condition or a location on a substrate;
determining first inputs to a first process model based on the processing condition or the location, the first process model being a machine learning model;
determining, by a hardware computer, an output of the first process model from the first inputs;
determining second inputs to a second process model based on the processing condition or the location, the second process model being a non-machine learning model;
determining, by the hardware computer, an output of the second process model from the second inputs; determining deviations between the output of the first process model and the output of the second process model; and
upon determination that the deviations satisfy a condition, adjusting the first process model.

23. The method of clause 22, wherein the first process model is trained based on the second process model.

24. The method of clause 22 or clause 23, wherein the deviations depend on the location or the processing condition.

25. The method of any of clauses 22-24, wherein adjusting the first process model comprises retraining the first process model.

26. The method of any of clauses 22-25, wherein adjusting the first process model comprises combining the first process model with the second process model.

27. A method comprising:
obtaining a target value of a characteristic of a result of a patterning process;
obtaining values of one or more characteristics of the patterning process that would achieve that result; and
determining, by a hardware computer, a model based on training data comprising samples whose feature vector comprises the target value and whose supervisory signal comprises the values of the one or more characteristics of the patterning process.

28. The method of clause 27, wherein the result is an image formed by the patterning process.

29. The method of clause 28, wherein the characteristic of the result is a CD in the image.

30. The method of clause 28, wherein the characteristic of the result is a location of an edge in the image.

31. A computer program product comprising a non-transitory computer readable medium having instructions recorded thereon, the instructions when executed by a computer implementing a method of any of clauses 1-30.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
   obtaining values of inputs of a process model of a patterning process;
   obtaining values of a first set of one or more physical characteristics of an image formed on a substrate under a processing condition represented by the values of the inputs;
   obtaining simulated values of a second set of one or more characteristics of the image; and
   determining, by a hardware computer, the process model based on training data comprising samples whose feature vector comprises the values of the inputs and whose supervisory signal comprises the values of the first set, and based on the simulated values of the second set, the process model configured to output one or more physical characteristics of an image formed on a substrate using the patterning process or output one or more characteristics of the patterning process to achieve a particular result of the patterning process.

2. The method of claim 1, wherein the values of the inputs are obtained from a design layout or by measurements on the patterning process.

3. The method of claim 1, further comprising computing a cost function of the inputs.

4. The method of claim 3, wherein the cost function represents a deviation between an output of the process model and a target value.

5. The method of claim 3, further comprising, upon determination that a termination condition is not satisfied, adjusting one or more values of the values of the inputs.

6. The method claim 5, wherein the adjusting the values of the inputs is based on a gradient of the cost function with respect to one or more values of the values of the inputs.

7. The method of claim 5, wherein the adjusting the values of the inputs comprises retraining the process model.

8. The method of claim 1, wherein the first set of one or more characteristics of the image is a CD in the image.

9. The method of claim 1, wherein the first set of one or more characteristics of the image is a location of an edge in the image.

10. The method of claim 1, wherein the values of the inputs comprise values of one or more characteristics of an illumination, of one or more characteristics of projection optics, of one or more characteristics of a patterning device, and/or of one or more characteristics of one or more post-exposure procedures.

11. The method of claim 1, wherein the values of the first set are obtained by measuring the image or simulating the image.

12. The method of claim 1, wherein the first set and the second set are different.

13. The method of claim 1, wherein the simulated values are obtained based on the values of the inputs.

14. The method of claim 1, wherein determining the process model comprises using the simulated values as a constraint.

15. A computer program product comprising a non-transitory computer readable medium having instructions therein, the instructions, upon execution by a computer system, configured to cause the computer system to at least:
   obtain values of inputs of a process model of a patterning process;
   obtain values of a first set of one or more physical characteristics of an image formed on a substrate under a processing condition represented by the values of the inputs;
   obtain simulated values of a second set of one or more characteristics of the image; and
   determine the process model based on training data comprising samples whose feature vector comprises the values of the inputs and whose supervisory signal comprises the values of the first set, and based on the simulated values of the second set, the process model configured to output one or more physical characteristics of an image formed on a substrate using the patterning process or output one or more characteristics of the patterning process to achieve a particular result of the patterning process.

16. The computer program product of claim 15, wherein the values of the inputs are obtained from a design layout or by measurements on the patterning process.

17. The computer program product of claim 15, wherein the instructions are further configured to cause the computer system to compute a cost function of the inputs.

18. The computer program product of claim 15, wherein the values of the first set are obtained by measuring the image or simulating the image.

19. The computer program product of claim 15, wherein the first set and the second set are different.

20. The computer program product of claim 15, wherein the simulated values are obtained based on the values of the inputs.

21. The computer program product of claim 15, wherein the simulated values of the second set are used as a constraint in training of the process model using the training data, wherein a retraining of the process model is triggered based on the simulated values of the second set, and/or wherein a combining of the process model with another model is triggered based on the simulated values of the second set.

22. The method of claim 1, wherein the simulated values of the second set are used as a constraint in training of the process model using the training data, wherein a retraining of the process model is triggered based on the simulated values of the second set, and/or wherein a combining of the process model with another model is triggered based on the simulated values of the second set.

* * * * *